United States Patent
Hortop (10) Patent No.: US 7,329,469 B2
(45) Date of Patent: Feb. 12, 2008

(54) METHOD OF ESTABLISHING CONNECTIONS BETWEEN MEASURING ELECTRONICS AND FUEL CELL STACK

(75) Inventor: Matthew K Hortop, Rochester, NY (US)

(73) Assignee: General Motors Corporation, Detroit, MI (US)

( * ) Notice: Subject to any disclaimer, the term of this patent is extended or adjusted under 35 U.S.C. 154(b) by 567 days.

(21) Appl. No.: 10/914,018

(22) Filed: Aug. 6, 2004

(65) Prior Publication Data

US 2006/0029838 A1     Feb. 9, 2006

(51) Int. Cl.
*H01M 8/00*     (2006.01)
*H01M 8/24*     (2006.01)

(52) U.S. Cl. .......................................... 429/12; 429/32
(58) Field of Classification Search ...................... None
See application file for complete search history.

(56) References Cited

U.S. PATENT DOCUMENTS

| | | |
|---|---|---|
| 4,402,563 A | 9/1983 | Sinclair |
| 4,867,697 A | 9/1989 | Borges |
| 5,272,017 A | 12/1993 | Swathirajan et al. |
| 5,316,871 A | 5/1994 | Swathirajan et al. |
| 5,763,113 A | 6/1998 | Meltser et al. |
| 2004/0227518 A1* | 11/2004 | Joos et al. ................... 324/434 |

FOREIGN PATENT DOCUMENTS

EP    1 001 666 A2    5/2000

* cited by examiner

*Primary Examiner*—Jonathan Crepeau (57) ABSTRACT

A printed circuit board that enables electrical communication between a fuel cell stack and measuring electronics includes a substrate having first and second sides and a plurality of pad sets formed in the substrate. Each of the pad sets includes a plurality of conductive pads that enable electrical communication between the first and second sides and a plurality of fusable links that enable electrical communication between the conductive pads on the first side. Each of the pad sets aligns with a corresponding separator plate to enable electrical communication between the separator plate and the measuring electronics.

18 Claims, 7 Drawing Sheets

METHOD OF ESTABLISHING CONNECTIONS BETWEEN MEASURING ELECTRONICS AND FUEL CELL STACK

FIELD OF THE INVENTION

The present invention relates to fuel cell stacks, and more particularly to connecting measuring electronics to a fuel cell stack.

BACKGROUND OF THE INVENTION

Fuel cell systems are increasingly used as a power source in a wide variety of applications. Fuel cell propulsion systems have also been proposed for use in vehicles as a replacement for internal combustion engines. The fuel cells generate electricity that is used to charge batteries and/or to power an electric motor. A solid-polymer-electrolyte fuel cell includes a membrane that is sandwiched between an anode and a cathode, referred to as an MEA or membrane electrode assembly. MEA's are sandwiched between conductive separator plates. To produce electricity through an electrochemical reaction, a fuel, commonly hydrogen ($H_2$), but also either methane ($CH_4$) or methanol ($CH_3OH$), is supplied to the anode and an oxidant, such as oxygen ($O_2$) is supplied to the cathode. The source of the oxygen is commonly air.

Measuring electronics are implemented to monitor the performance of the fuel cells of the fuel cell stack. More specifically, the measuring electronics can monitor operating parameters including, but not limited to, individual fuel cell voltage, individual fuel cell current, stack voltage and stack current. The fuel cell stack can be controlled based on the operating parameters.

Traditional connection methods between the measuring electronics and the fuel cells of the fuel cell stack retain specific disadvantages. One disadvantage is the tradition connection methods can not account for variations in fuel cell widths, which are compounded when aligning adjacent fuel cells in a fuel cell stack. As a result, traditional connection methods fail to provide an electrical connection between each of the fuel cells in the fuel cell stack and the measuring electronics.

SUMMARY OF THE INVENTION

Accordingly, the present invention provides a printed circuit board that enables electrical communication between a fuel cell stack and measuring electronics. The printed circuit board includes a substrate having first and second sides and a plurality of pad sets formed in the substrate. Each of the pad sets includes a plurality of conductive pads that enable electrical communication between the first and second sides and a plurality of fusable links that enable electrical communication between the conductive pads on the first side. Each of the pad sets aligns with a corresponding separator plate to enable electrical communication between the separator plate and the measuring electronics.

In one feature, a pad set is aligned across adjacent separator plates. At least one of the fusable links is destroyed to prevent electrical communication between the adjacent separator plates.

In another feature, a distance between the pad sets is equal to a minimum width of the separator plates.

In another feature, a width of each of the conductive pads is less than a minimum width of membrane electrode assemblies (MEAs) of the fuel cells.

In still another feature, a width of each of the pad sets is at least equal to a distance between membrane electrode assemblies (MEAs) of the fuel cells.

In yet other features, each of the pad sets is at an angle relative to the fuel cells. Facing side edges of adjacent substrates are essentially parallel to a long axis of each of the pad sets to enable alignment of respective adjacent printed circuit boards.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses.

Figure 1:
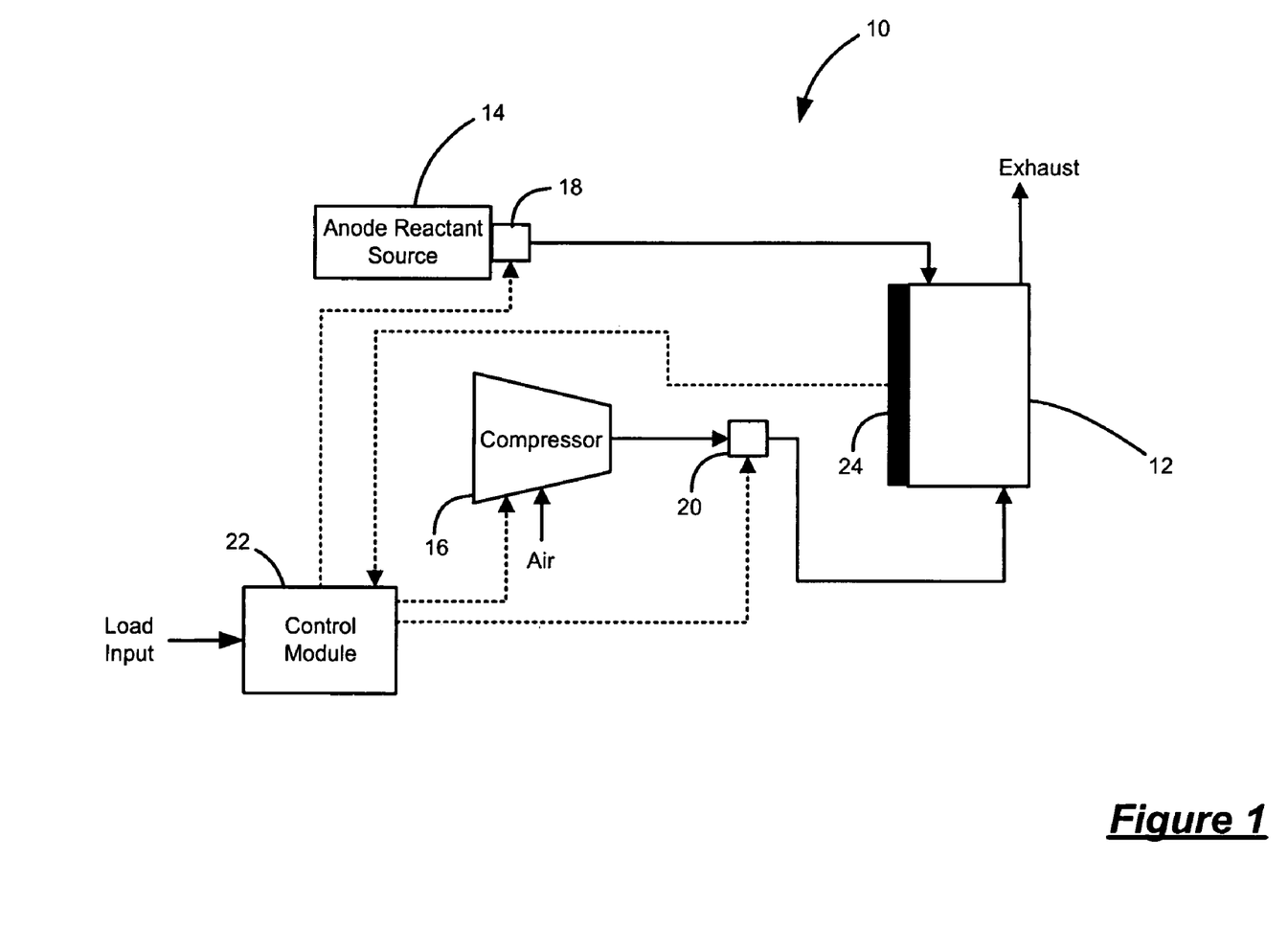
FIG. 1 is a schematic illustration of an exemplary fuel cell system including a fuel cell stack having measuring electronics connected thereto in accordance with the present invention.

Referring now to FIG. 1, an exemplary fuel cell system 10 is illustrated. The fuel cell system 10 includes a fuel cell stack 12, a hydrogen storage system 14 and a compressor 16. The hydrogen storage system 14 includes a pressure management system 18, which regulates a hydrogen flow to an anode side of the fuel cell stack 12. The compressor 16 provides pressurized, oxygen-rich air to a cathode side of the fuel cell stack 12 through a regulator 20. Reactions between the hydrogen and oxygen within the fuel cell stack 12 generate electrical energy that is used to drive a load (not shown). A control module 22 regulates overall operation of the fuel cell system 10. Measuring electronics 24 monitor characteristics (e.g., voltage, current) of the fuel cells of the fuel cell stack 12 and communicate corresponding signals to the control module 22. The control module 22 regulates operation of the fuel cell system based on a load input and the signals generated by the measuring electronics 24 of the fuel cell system 10. The load input indicates the desired electrical energy output from the fuel cell stack 12. For example, in the case of a vehicle, the load input could include a throttle.

Figure 2:
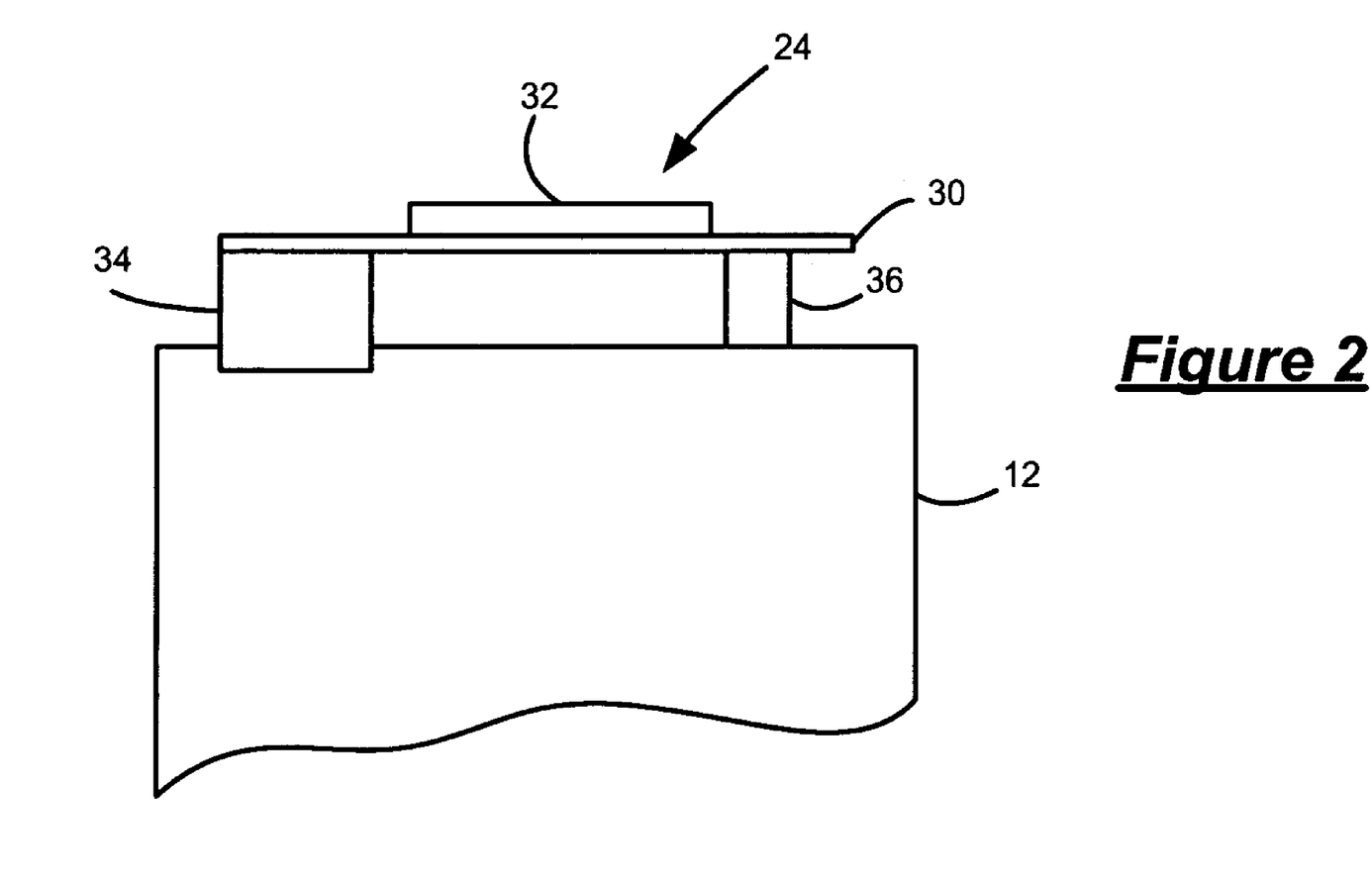
FIG. 2 is a schematic side-view of the fuel cell stack and the measuring electronics including a printed circuit board (PCB) according to the present invention.

Referring now to FIG. 2, the measuring electronics 24 and a portion of the fuel cell stack 12 are schematically illustrated. The measuring electronics 24 include a printed circuit board (PCB) 30 and electrical components 32. Although not illustrated in detail, the components 32 can include, but are not limited to, an application specific integrated circuit (ASIC), a processor, memory, input/output (I/O) interfaces, sensors (i.e., current sensor, voltage sensor), a transformer and the like. The measuring electronics 24 are in electrical communication with each fuel cell of the fuel cell stack 12 via an interface 34, as described in further detail below. A support 36 can also be provided to improve the integrity of the electrical connection between the fuel cells and the measuring electronics 24. More specifically, the support 36 supports the measuring electronics 24 on the fuel cell stack 12 to prohibit undesired movement of the measuring electronics 24.

Figure 3:
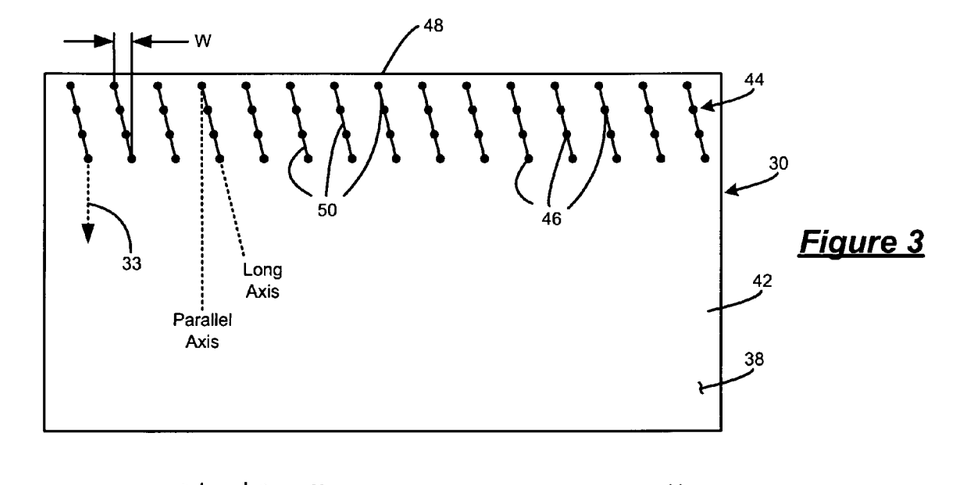
FIG. 3 is a plan view of an electronics side of the PCB illustrating a plurality of pad sets each including a plurality of conductive pads connected by fusable links.
Figure 4:
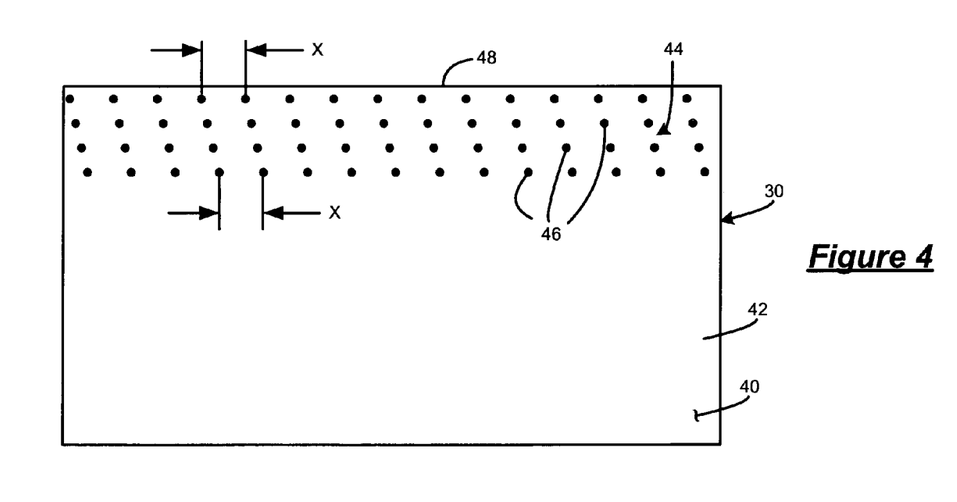
FIG. 4 is a plan view of a fuel cell stack side of the PCB illustrating the conductive pads of the pad sets of FIG. 3.

Referring now to FIGS. 3 and 4, first and second sides 38,40 of the PCB of the present invention are respectively illustrated. The first side 38 or component side is the side that faces away from the fuel cell stack 12. The second side 40 or stack side is the side that faces the fuel cell stack 12. The PCB 30 includes a support substrate 42 and a plurality of pad sets 44 formed thereon. Each of the pad sets 44 includes a plurality of conductive pads 46 that are formed through the substrate 42 to enable electrical communication between the first and second sides 38,40. Although each pad set 44 is illustrated to include four conductive pads 46, it is appreciated that more or fewer conductive pads 46 can be included in each pad set 44. Each of the pad sets 44 further include fusable links 50 formed on the first side 38 that enable electrical communication between the conductive pads 46. The pad sets 44 are in further electrical communication with the components 32 through conductive vias or paths 33. In this manner, electrical signals flow from the fuel cells, through the interface 34, through one or more of the conductive pads 46 and through the conductive paths to the components 32 of the measuring electronics 24.

The pad sets 44 run at an angle relative to an edge 48 of the PCB 30 and include a width (W). W is defined as the lateral distance between the first conductive pad 46 and the last conductive pad 46 of the pad set 44. A repeat distance (X) is defined between the pad sets 44. More specifically, X is defined between corresponding conductive pads 46 of adjacent pad sets 44. For example, X is defined between the first conductive pad 46 in a pad set 44 and the first conductive pad 46 in an adjacent pad set 44.

Figure 5:
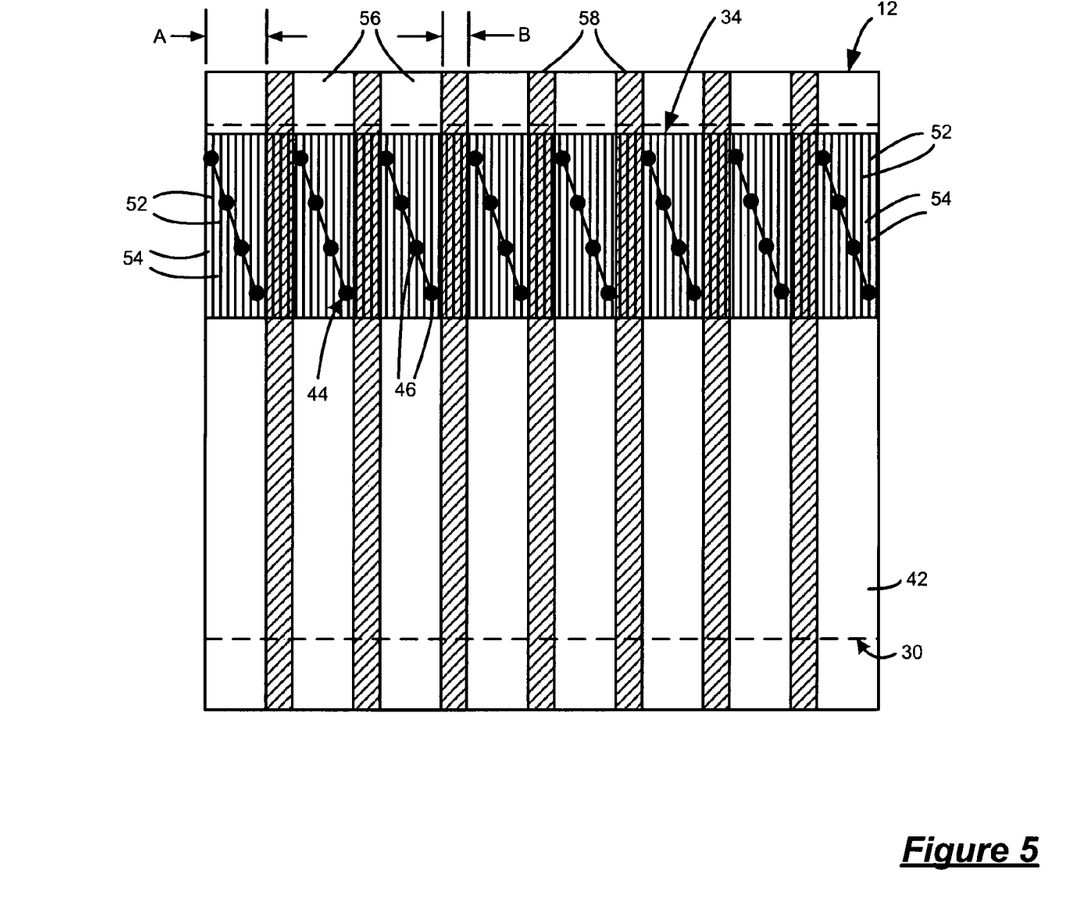
FIG. 5 is a plan view of a portion of the PCB and a portion the fuel cell stack illustrating alignment of the pad sets with corresponding separator plates of the fuel cell stack based on a minimum width of the separator plates.

Referring now to FIG. 5 a portion of the fuel cell stack 12 and the PCB 30 are illustrated. For purposes of simplifying the description, the substrate 42 is shown in phantom. The interface 34 is provided as a zebra strip that includes a flexible material 52 impregnated with columns of high resistance conductive paths 54. Corresponding columns of flexible material 52 separate the conductive paths 54. One side of the interface lays against conductive separator plates 56 that separate membrane electrode assemblies (MEAs) 58 of the fuel cell stack 12. Another face of the interface 34 lays against the stack side 40 of the PCB 30, contacting the conductive pads 46. Electric signals from a separator plate 56 flow through the immediately adjacent conductive paths 54 of the interface 34 to the corresponding conductive pads 46 of the pad set 44 that aligns with the particular separator plate 56.

Figure 6:
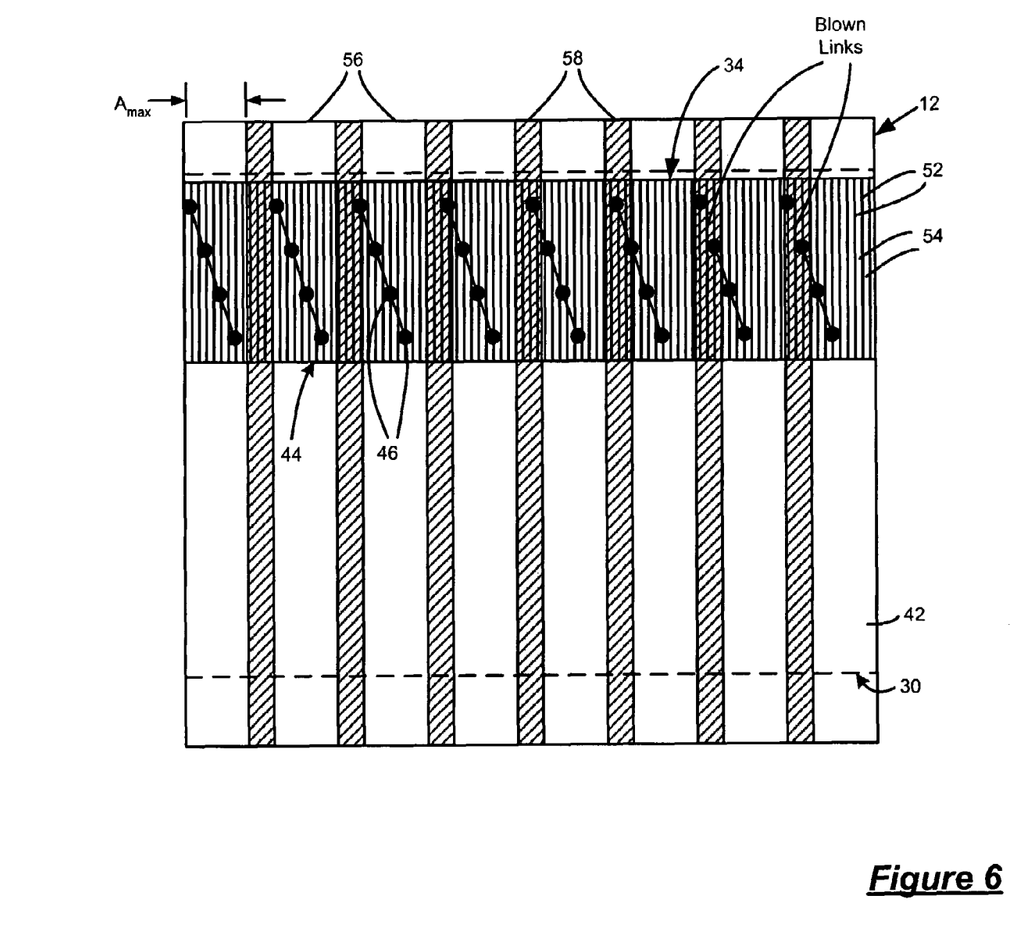
FIG. 6 is a plan view of the PCB and the fuel cell stack illustrating alignment of the pad sets with corresponding separator plates of the fuel cell stack based on a maximum width of the separator plates.

Referring now to FIGS. 5 and 6, a width (A) of the separator plates 56 can vary between a minimum ($A_{MIN}$) and a maximum ($A_{MAX}$) as a result of build tolerances. A width (B) of the MEAs 58 can vary between a minimum ($B_{MIN}$) and a maximum ($B_{MAX}$). The value of A for each separator plate 56 of FIG. 5 is equal to $A_{MIN}$. The width (W) of the pad sets 44 is approximately equal to or just greater than $A_{MIN}$, or the minimum width of the separator plates 56. In this manner, each pad set 44 is aligned with a single separator plate 56. The width of each separator plate 56 of FIG. 6 is equal to $A_{MAX}$, or the maximum width of the separator plates 56 (i.e., worst-case tolerance stack-up). The width or diameter of each conductive pad 46 is preferably less than $B_{MIN}$. In this manner, a single conductive pad 46 cannot bridge adjacent separator plates 56 across an MEA 58.

Because the width (W) of the pad set 46 is fixed, the pad sets 44 gradually come out of alignment with the separator plate 56 in the worst-case tolerance stack-up. As a result, a pad set 44 can be aligned across multiple separator plates 56. Alignment of a pad set 44 across multiple separator plates 56 induces a short circuit across the pad set 44. The short-circuit causes one or more fusable links 50 to blow terminating electrical communication between one or more conductive pads 46 and the remaining interconnected conductive pads 46. In this manner, each pad set 44 enables electrical communication between a single separator plate 56 and the components 32 regardless of whether a particular pad set 44 is aligned across multiple separator plates 56. The size of the fusable links 50 are chosen such that a fusable link 50 will burn off before the current achieves too high a level (e.g., 0.25 A). The level is chosen so as to prevent degradation or damage to fuel cell components.

Figure 7:
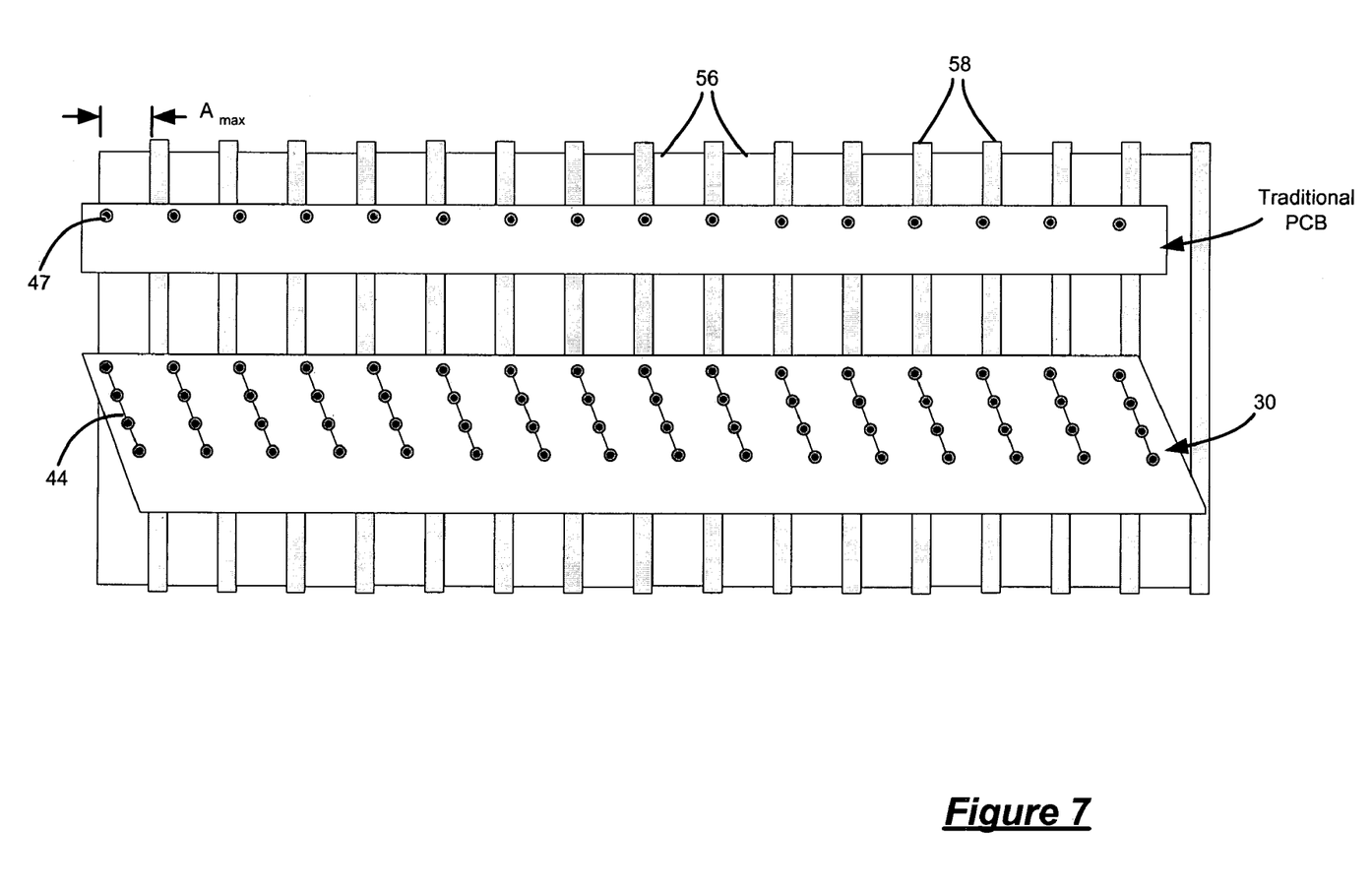
FIG. 7 is a plan view of the PCB and the fuel cell stack illustrating alignment of the pad sets and alignment of traditional conductive pads with corresponding separator plates of the fuel cell stack based on the maximum width of the separator plates.

Referring now to FIG. 7, an advantage of the PCB 30 of the present invention is illustrated. The width of each separator plate 56 of FIG. 7 is equal to $A_{MAX}$ to illustrate the worst-case tolerance stack-up. A traditional PCB is illustrated adjacent to the PCB 30 of the present invention. The traditional PCB includes a single conductive pad 46 per separator plate 56. Because the distance between the conductive pads 47 can not account for variances in the separator plates, the conductive pads 47 can be misaligned relative to a corresponding separator plate 56. Such misalignment arranges the conductive pad 47 adjacent an MEA 58 rather than a separator plate 56. As a result, there is no conductive path enabled between the separator plate 56 and the measuring electronics 24 for several separator plates. The PCB 30 Of the present invention ensures a conductive path is always present between each of the separator plates 56 and the measuring electronics 24.

Figure 8:
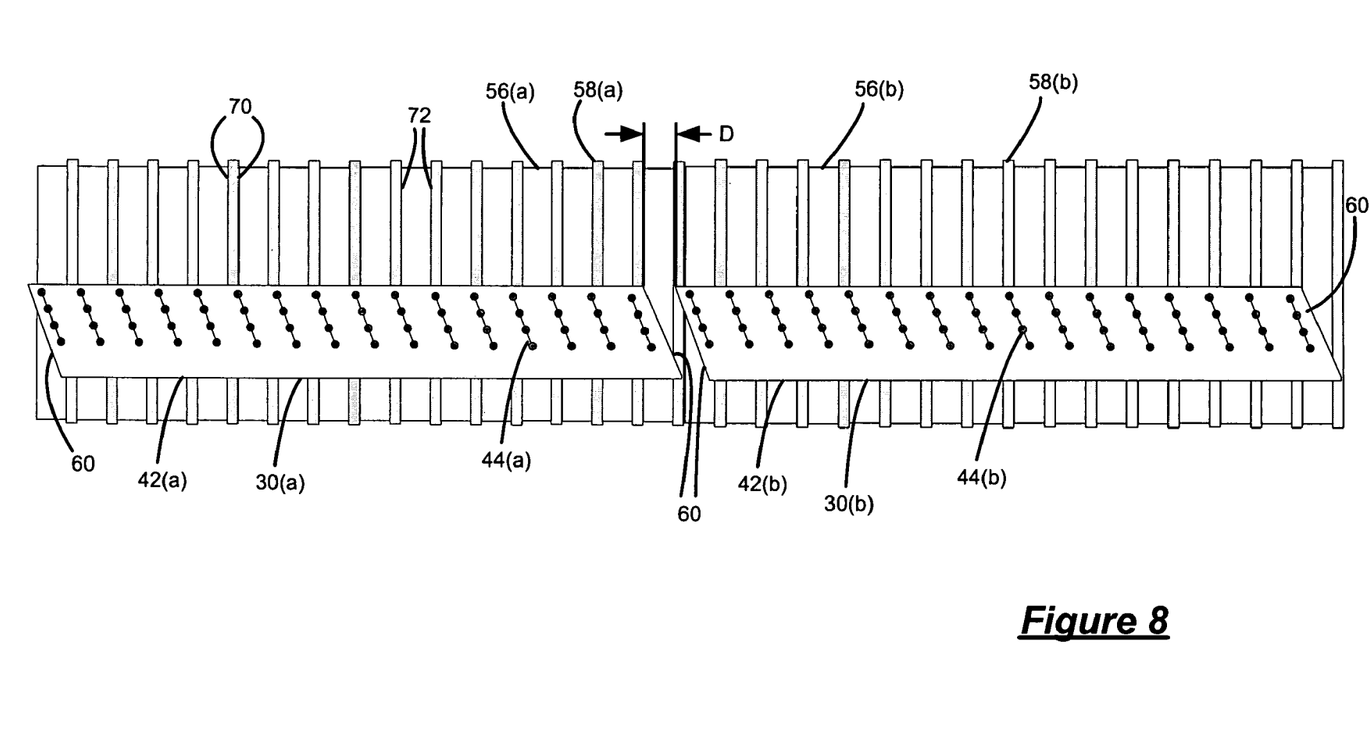
FIG. 8 is a plan view of multiple PCB's and the fuel cell stack illustrating a geometric configuration of each PCB that enables adjacent alignment of the PCB's.

Referring now to FIG. 8, multiple PCB's 30 can be implemented to ensure that the pad sets 44 themselves do not become misaligned from their respective separator plates 56. More specifically, depending upon the number of fuel cells of the fuel cell stack 12, a single PCB 30 may not compensate for separator plate variations in extreme cases. For example, the last pad set 44(a) in a PCB 30(a) may be close to being misaligned from a corresponding separator plate 56(a). Therefore, the adjacent PCB 30(b) is offset a distance (D) such that the first pad set 44(b) of the adjacent PCB 30(b) is fully aligned with the corresponding separator plate 56(b).

Edges 60 of the substrates 42 of the PCBs 30 are formed at an angle that is approximately equal to the slant angle of the pad sets 44. Thus, the edges 60 of adjacent substrates 60 are generally parallel to a long axis of the pad sets 44. More specifically, the slant angle is defined as the angle between a first axis that is essentially parallel to edges 70 of the MEAs 58 and edges 72 of the separator plates 56 and a second axis defined by the long axis of the pad sets 44. In this manner, PCB's 30 can be placed adjacent to one another without interference.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A printed circuit board that enables electrical communication between a fuel cell stack and measuring electronics, comprising: a substrate having first and second sides; and a plurality of pad sets formed in said substrate, each of said pad sets comprising: a plurality of conductive pads that enable electrical communication between said first and second sides; and a plurality of fusable links that enable electrical communication between said conductive pads on said first side; wherein each of said pad sets aligns with a single corresponding separator plate of a fuel cell to enable electrical communication between said single corresponding separator plate and said measuring electronics.

2. The printed circuit board of claim 1 comprising one of said pad sets aligned across adjacent separator plates and wherein at least one of said fusable links is destroyed to prevent electrical communication between said adjacent separator plates.

3. The printed circuit board of claim 1 wherein a repeat distance between said pad sets corresponds to a minimum width of said separator plate and a membrane electrode assembly (MEA) of said fuel cell.

4. The printed circuit board of claim 1 wherein a width of said conductive pad is less than a minimum width of a membrane electrode assembly (MEA) of said fuel cell.

5. The printed circuit board of claim 1 wherein a width of said pad set corresponds to a width of said separator plate of said fuel cell.

6. The printed circuit board of claim 1 wherein said pad set is at an angle relative to said fuel cell.

7. The printed circuit board of claim 6 wherein facing side edges of adjacent substrates are essentially parallel to a long axis of corresponding pad sets to enable alignment of respective adjacent printed circuit boards.

8. A fuel cell stack that communicates with measuring electronics, comprising: a plurality of membrane electrode assemblies (MEAs) separated by separator plates; and a printed circuit board that enables electrical communication between said separator plates and said measuring electronics, comprising: a substrate having first and second sides; and a plurality of pad sets formed in said substrate, each of said pad sets comprising: a plurality of conductive pads that enable electrical communication between said first and second sides; and a plurality of fusable links that enable electrical communication between said conductive pads on said first side; wherein each of said pad sets aligns with a single corresponding separator plate to enable electrical communication between said single corresponding separator plate and said measuring electronics.

9. The fuel cell stack of claim 8 comprising one of said pad sets aligned across adjacent separator plates and wherein at least one of said fusable links is destroyed to prevent electrical communication between said adjacent separator plates.

10. The fuel cell stack of claim 8 wherein a repeat distance between said pad sets corresponds to a minimum width of said separator plate and said MEA.

11. The fuel cell stack of claim 8 wherein a width of each of said conductive pads is less than a minimum width of said MEA.

12. The fuel cell stack of claim 8 wherein a width of said pad set corresponds to a width of said separator plate.

13. The fuel cell stack of claim 8 wherein said pad set is at an angle relative to said fuel cell.

14. The fuel cell stack of claim 13 wherein facing side edges of adjacent substrates are essentially parallel to a long axis of each of said pad sets to enable alignment of respective adjacent printed circuit boards.

15. The fuel cell stack of claim 8 further comprising an interface that enables electrical communication between said separator plates and said PCB.

16. The fuel cell stack of claim 15 wherein the interface includes regions of electrically conductive paths separated by regions of non-electrically conductive material.

17. The fuel cell stack of claim 8 wherein a width of said pad set is at least equal to a width of said MEA.

18. The fuel cell stack of claim 8 wherein a repeat distance between said pad sets is equal to a minimum width of said separator plate and said MEA.

* * * * *